United States Patent
Wattyn et al.

(10) Patent No.: US 12,072,634 B2
(45) Date of Patent: Aug. 27, 2024

(54) METHOD AND APPARATUS FOR WRITING IMAGEABLE MATERIAL USING MULTIPLE BEAMS

(71) Applicant: XEIKON PREPRESS N.V., Ypres (BE)

(72) Inventors: Bart Mark Luc Wattyn, Dentergem (BE); Dirk Ludo Julien De Rauw, Ninove (BE)

(73) Assignee: XSYS PREPRESS N.V., Ypres (BE)

( * ) Notice: Subject to any disclaimer, the term of this patent is extended or adjusted under 35 U.S.C. 154(b) by 351 days.

(21) Appl. No.: 17/695,372

(22) Filed: Mar. 15, 2022

(65) Prior Publication Data

US 2022/0203704 A1 Jun. 30, 2022

Related U.S. Application Data

(62) Division of application No. 16/619,314, filed as application No. PCT/EP2018/065040 on Jun. 7, 2018, now Pat. No. 11,305,554.

(30) Foreign Application Priority Data

Jun. 12, 2017 (NL) ..................................... 2019051

(51) Int. Cl.
  *B41J 2/455* (2006.01)
  *B41C 1/10* (2006.01)
  (Continued)

(52) U.S. Cl.
  CPC .......... *G03F 7/2053* (2013.01); *B41C 1/1033* (2013.01); *B41J 2/455* (2013.01); *B41M 1/04* (2013.01); *G03G 15/043* (2013.01)

(58) Field of Classification Search
  CPC .......... B41J 2/455; B41C 1/05; B41C 1/1033; B41M 1/04; G03F 7/2053; G03G 15/043;
  (Continued)

(56) References Cited

U.S. PATENT DOCUMENTS

| 6,120,951 A * | 9/2000 | Klein ................. G06K 15/1204 |
| | | 430/30 |
| 6,972,783 B2 | 12/2005 | Takamatsu et al. |

(Continued)

FOREIGN PATENT DOCUMENTS

| CN | 1330291 A | 1/2002 |
| CN | 102105309 A | 6/2011 |

(Continued)

OTHER PUBLICATIONS

International Search Report and Written Opinion for the International Patent Application No. PCT/EP2018/065040, dated Jul. 9, 2018, 8 pages.

*Primary Examiner* — Anh T Vo
(74) *Attorney, Agent, or Firm* — KDW Firm PLLC

(57) ABSTRACT

A method for writing an imageable material using multiple beams includes preparing subsequent patterns each having Y rows of N pixel locations, said subsequent patterns including first and second patterns; where the first and the second pattern overlap with each other in an overlap area consisting of O columns and Y rows of pixel locations; selecting for each row i of said first pattern Mi1 pixel locations; selecting for each row i of said second pattern Mi2 pixel locations; writing simultaneously, for each row i, said Mi1 selected pixel locations by moving the N beams in a fast scan direction relative to said imageable material; and moving said N beams relative to said imageable material in a slow scan direction over (N-O) pixel locations; writing simultaneously, for each row i, said Mi2 selected pixel locations by moving the N beams in a fast scan direction relative to said imageable material.

20 Claims, 5 Drawing Sheets

(51) Int. Cl.
*B41M 1/04* (2006.01)
*G03F 7/20* (2006.01)
*G03G 15/043* (2006.01)

(58) Field of Classification Search
CPC .. G03G 15/102; G03G 15/105; G03G 15/107; G03G 15/1242; G03G 15/1247
See application file for complete search history.

(56) References Cited

U.S. PATENT DOCUMENTS

| | | |
|---|---|---|
| 6,985,261 B2 * | 1/2006 | Klein ................... H04N 1/0473 358/3.29 |
| 7,193,641 B2 | 3/2007 | Klein et al. |
| 2002/0130946 A1 | 9/2002 | Pierson |
| 2004/0130613 A1 | 7/2004 | To et al. |
| 2017/0161594 A1 | 6/2017 | Casaldaliga Albisu et al. |

FOREIGN PATENT DOCUMENTS

| | | |
|---|---|---|
| JP | 2002321333 A | 11/2002 |
| JP | 2004109680 A | 4/2004 |

\* cited by examiner

METHOD AND APPARATUS FOR WRITING IMAGEABLE MATERIAL USING MULTIPLE BEAMS

CROSS-REFERENCE TO RELATED APPLICATIONS

This is a continuation of U.S. patent application Ser. No. 16/619,314, filed Dec. 4, 2019, which is a national stage application filed under 35 U.S.C. § 371 of international application PCT/EP2018/065040 filed Jun. 7, 2018, which claims priority to Netherlands Patent application NL2019051, filed Jun. 12, 2017, the entirety of which applications are incorporated by reference herein.

FIELD OF INVENTION

The field of the invention relates to ablative imaging, in particular in flexography printing, and in particular to a method and apparatus for writing an ablative or thermally sensitive imageable material using multiple beams.

BACKGROUND

The technical field relates to exposing imageable material using multiple exposing beams, and in particular to processing data for computer-to-plate ablative imaging with multiple beams, e.g. multiple laser beams.

Ablative imaging is used in flexography printing. A flexographic plate, e.g. a rubber or photopolymer plate, is provided with relief areas corresponding to zones to be inked and floor areas corresponding to zones not to be inked. Contacting the flexographic plate with an inking roller, such as an anilox roller, inks the flexographic plate. The inked flexographic plate is brought in contact with a substrate to produce the desired image on the substrate.

When a plate is exposed by multiple beams that simultaneously form groups of tracks on the plate, relative motion is produced between the plate and the multiple beams in both a fast scan direction in which several tracks are laid simultaneously, and a slow scan direction substantially perpendicular to the fast scan direction. Transferring imaging data onto a substrate by means of ablative imaging with multiple beam methods often results in a visible stitching line in the areas between the individual multiple beam groups, resulting in stitching artefacts disturbing the homogeneity of the imaging appearance to the human eye. Thus there is a need for a method and apparatus of exposing a plate using multiple beams that prevents such stitching artefacts which are detectable by the human eye.

This problem has been recognized before. U.S. Pat. No. 5,818,498 describes a method of avoiding stitching by using an overlap of at least one track to avoid a visible border at the point where one group of channels, written at the same time, meets a second group of channels. The overlapped area is written twice with identical data. This approach has the disadvantage that more beams are used than necessary for the imaging advance. Furthermore, double-imaging a track with the same data on an ablative media may result in a different appearance of such a track compared to those tracks that were imaged only once.

U.S. Pat. No. 7,193,641 discloses shifting the beam groups into each other, wherein each pixel is imaged only once. The shifting mechanism causes the line between groups to be "broken up" or irregular. In that manner the line between groups becomes less visible to the human eye. The shifting includes shifting in the slow scan direction. The scan after shifting in the slow-scan direction is for an integral number denoted L of pixels, in the fast scan direction. Furthermore, the non-shifted scan continues for an integral number denoted K of pixels, in the fast scan direction before the next shift. Thus, for an imaging system designed to image at least a number N of tracks simultaneously, K sets of N pixels are imaged in a progression of K pixels in the fast scan direction, the L sets of N pixels are imaged with an offset in the slow scan direction of a number, denoted M, of pixels. The shifted and unshifted sets alternate until a complete length in the fast scan direction of the medium has occurred. In an embodiment, the imaging device is capable of simultaneously directing at least M+N modulated beams onto the medium, and the shift in the slow scan direction is realized by selecting an appropriate subset of N channels of the at least N+M possible channels for imaging the N pixels simultaneously.

SUMMARY

The object of embodiments of the invention is to provide a method and apparatus which further improve stitching artefacts and which allow for a fast exposing of imageable material using multiple beams.

According to a first aspect of the invention there is provided a method for writing an imageable material using multiple beams, such as laser beams, wherein N beams are available and N is at least four. The method comprises the following steps:

preparing subsequent patterns each having Y rows of N pixel locations, said subsequent patterns including a first and a second pattern; wherein the first and the second pattern overlap with each other in an overlap area consisting of O columns and Y rows of pixel locations, wherein O is at least two and smaller than N;

selecting for each row i of said first pattern Mi1 pixel locations;

selecting for each row i of said second pattern Mi2 pixel locations;

writing simultaneously, for each row i, said Mi1 selected pixel locations by moving the N beams in a fast scan direction relative to said imageable material; and next moving said N beams relative to said imageable material in a slow scan direction over (N-O) pixel locations;

writing simultaneously, for each row i, said Mi2 selected pixel locations by moving the N beams in a fast scan direction relative to said imageable material;

wherein said selecting is such that at least one of the following conditions is fulfilled:

(1) said Mi1 pixel locations of said first pattern are selected such that, for a row i, at least one selected pixel location thereof is separated from an adjacent selected pixel location by at least one non-selected pixel location located in the overlap area; and said Mi2 pixel locations of said second pattern are selected such that, for said row i, said non-selected pixel location of the first pattern is selected in the second pattern; wherein different rows of the first pattern contain selected pixel locations in different columns of the overlap area;

(2) said Mi1 pixel locations of said first pattern are selected such that, the number Mi1 is different for different rows and such that any non-selected pixel location of the first pattern is selected in the second pattern.

Embodiments of the invention are based inter alia on the insight that an overlap zone between subsequent patterns allows selecting pixel locations to be written such that a straight edge between selected pixel locations of different patterns is avoided. In particular, by leaving "holes" (unselected pixel locations) in the first pattern, in an overlap area between the first pattern and the second pattern, and filling up those "holes" by selecting those pixel locations in the second pattern (condition (1) above), a good mixing of the first and second pattern can be achieved. A similar result can be achieved by varying the number Mi1 of selected pixels per row in the first pattern, and selecting any non-selected pixel locations in the second pattern (condition (2)). In that manner stitching problems can be avoided or significantly limited.

In the context of the present invention the term "writing a pixel location" refers to exposing that pixel location by a beam which is set, e.g. by modulating the beam, in function of the image data for that pixel location.

It is noted that the first pattern and the second pattern may comprise the same pixel location in the overlap area, resulting in a pixel location being written twice. However, in preferred embodiments, the first and the second pattern do not comprise the same pixel location in the overlap area, such that all pixel locations are only written once.

In an exemplary embodiment Mi1 and Mi2 fulfil the inequality: N−2*O<=Mi1, Mi2<=N. According to a possible embodiment for each row i, Mi1 is selected at random from values in a range between N−2*O and N, wherein any pixel locations located in an area of the first pattern which does not overlap with adjacent patterns, are always selected. By choosing Mi1 at random an irregular edge between a zone written during a first pass of the N beams and a zone written during the second pass of the N beams can be obtained, resulting in a, for the human eye, "unperceivable" edge between the zones. According to a possible embodiment the selected pixel locations in the first and second pattern follow a regular pattern and at least condition (2) set out above is fulfilled. For example, the first pattern may have M11=M31=M51=m, and M21=M41=M61=m+1, etc., and the second pattern may have M12=M32=M52=m+1, and M22=M42=M62=m, etc. By choosing such patterns a broken edge between a zone written during a first pass of the N beams and a zone written during the second pass can be obtained, resulting in reduced stitching effects.

In a preferred embodiment Mi1 and Mi2 have a fixed or maximum value which is smaller than N, more preferably smaller than N−1, for each row i. For performing the writing, assuming that a total power P is available for the N beams, during the writing of the first pattern and the second pattern, respectively, the available power for each beam of the Mi1 beams and the Mi2 beams to be written simultaneously may correspond approximately with the total power P divided by the fixed or maximum value given to Mi1 and Mi2, respectively. In that way more power is available per beam, resulting in a faster evaporation, and hence allowing using a higher process speed.

According to another aspect of the invention there is provided a system for writing imageable material using multiple beams. The system comprises at least one imaging device, and a controller for controlling the at least one imaging device. An imaging device of the at least one imaging device is configured for generating N beams, wherein N is at least four. The controller is configured for preparing subsequent patterns each having Y rows of N pixel locations, said subsequent patterns including a first and a second pattern; wherein the first and the second pattern overlap with each other in an overlap area consisting of O columns and Y rows of pixel locations, wherein O is at least two and smaller than N;

selecting for each row i of said first pattern Mi1 pixel locations; and selecting for each row i of said second pattern Mi2 pixel locations;

The selecting is such that at least one of the following conditions is fulfilled:

(1) said Mi1 pixel locations of said first pattern are selected such that, for a row i, at least one selected pixel location thereof is separated from an adjacent selected pixel location (12) by at least one non-selected pixel location located in the overlap area; and said Mi2 pixel locations of said second pattern are selected such that, for said row i, said non-selected pixel location of the first pattern is selected in the second pattern; wherein different rows of the first pattern contain selected pixel locations in different columns of the overlap area;

(2) said Mi1 pixel locations of said first pattern are selected such that, the number Mi1 is different for at least two different rows and such that any non-selected pixel location of the first pattern is selected in the second pattern.

The controller is further configured for controlling said imaging device for writing simultaneously, for each row i, said Mi1 selected pixel locations by moving the N beams relative to said imageable material in a fast scan direction; for next moving said N beams relative to said imageable material in a slow scan direction over (N-O) pixel locations; and for then writing simultaneously, for each row i, said Mi2 selected pixel locations by moving the N beams relative to said imageable material in the fast scan direction.

It is noted that the controller may be one integral controller or may comprise a plurality of control parts at a distance of each other in the system.

In a preferred embodiment the imaging device is a laser imaging device. The laser imaging device is then controlled to expose a pixel location by a beam of the laser imaging device, said beam being set, e.g. by modulating the beam, in function of the image data for that pixel location.

In a possible embodiment the controller is configured to select for each row i, Mi1 at random from values in a range between N−2*O and N, wherein any pixel locations located in an area of the first pattern which does not overlap with adjacent patterns, are always selected. In another possible embodiment the controller is configured to select pixel locations such that the selected pixel locations in the first and second pattern follow a regular pattern and such that condition (2) formulated above is fulfilled.

In a preferred embodiment the controller is configured to select pixel locations such that Mi1 and Mi2 have a fixed or maximum value which is smaller than N, more preferably smaller than N−1, for each row i. When assuming that, for performing the writing, a total power is available for the N beams, then, preferably, the controller is configured to control the powering during the writing of the first pattern and the second pattern, respectively, such that the available power for each beam of the Mi1 beams and the Mi2 beams to be written simultaneously corresponds approximately with the total power divided by the fixed or maximum value of Mi1 and Mi2, respectively. In that manner more power is available per beam (compared to a situation where the total power would be divided over N beams), resulting in a faster evaporation, and hence allowing using a higher process speed.

According to a further aspect of the invention, there is provided a computer program comprising computer-executable instructions to perform or control the method, when the program is run on a computer, according to any one of the steps of any one of the embodiments disclosed above.

According to a further aspect of the invention, there is provided a computer device or other hardware device programmed to perform or control one or more steps of any one of the embodiments of the method disclosed above. According to another aspect there is provided a data storage device encoding a program in machine-readable and machine-executable form to perform one or more steps of any one of the embodiments of the method disclosed above.

BRIEF DESCRIPTION OF THE FIGURES

The accompanying drawings are used to illustrate presently preferred non-limiting exemplary embodiments of devices of the present invention. The above and other advantages of the features and objects of the invention will become more apparent and the invention will be better understood from the following detailed description when read in conjunction with the accompanying drawings, in which.

DESCRIPTION OF EMBODIMENTS

Figure 1:
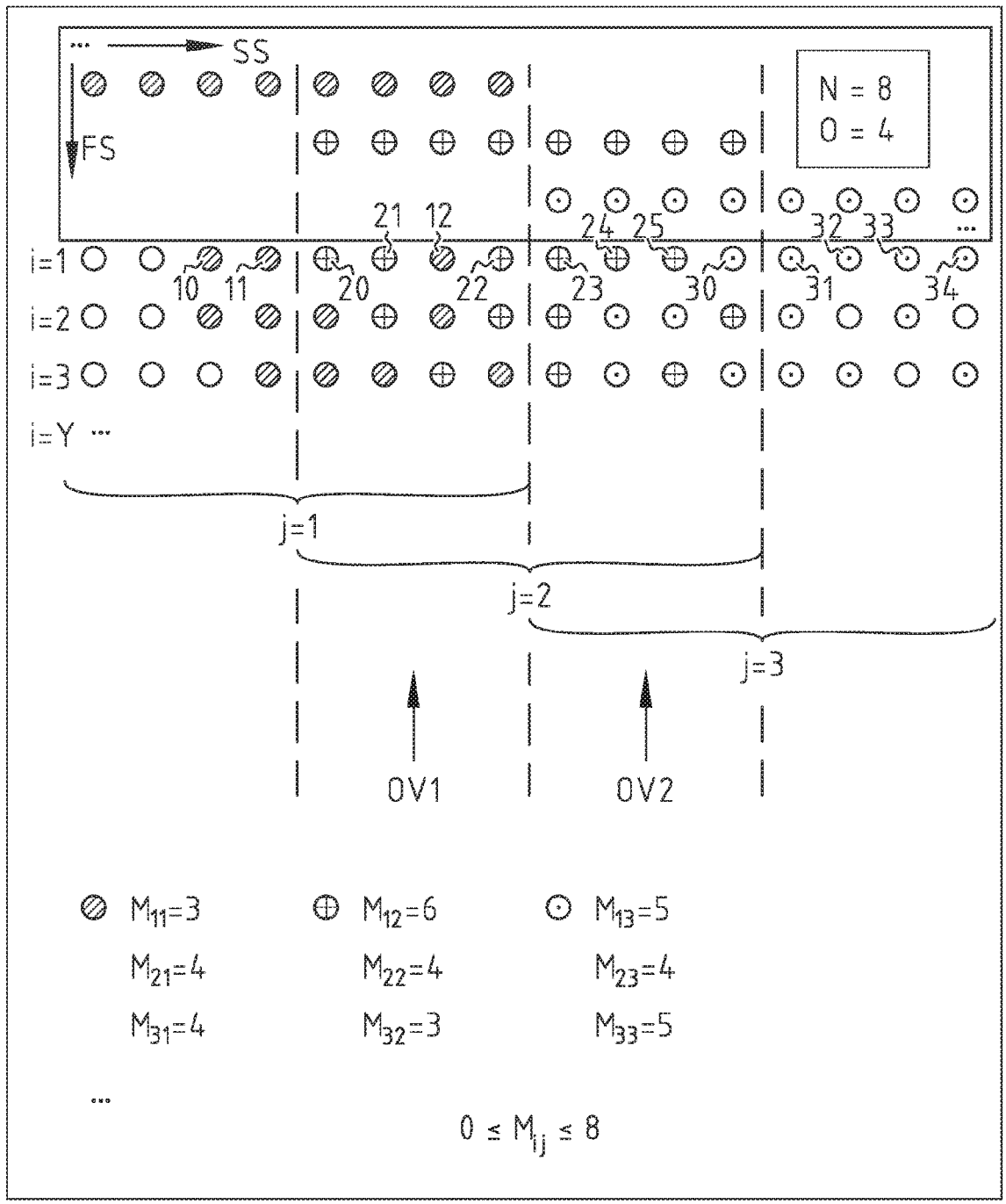
FIG. 1 illustrates schematically an exemplary embodiment of a method for writing imageable material using multiple beams, with N=8 and O=4.

FIG. 1 illustrates a first exemplary embodiment of a method for writing imageable material using N multiple beams. In the example N is 8. Using said N beams, N tracks of pixel locations, may be written simultaneously, wherein the N beams move in a fast scan direction FS. The beams extend next to each other in a slow scan direction SS.

The exemplary method comprises preparing subsequent patterns each having Y rows of N pixel locations. The subsequent patterns including a first pattern (j=1), a second pattern (j=2) and a third pattern (j=3). In the example it is assumed that one or more patterns are available before and after the first, second and third pattern. The first and the second pattern overlap with each other in an overlap area OV1 consisting of O columns and Y rows of pixel locations, wherein O is 4. Similarly, the second and the third pattern overlap with each other in an overlap area OV2 consisting of O columns and Y rows of pixel locations, wherein O is 4.

For each row i of the first pattern, Mi1 pixel locations to be written during a first pass of the N beams, are selected. The selected pixel locations are indicated with a hatching. In the first row (i=1) 3 pixel locations 10, 11, 12 are selected for being written during the first pass: M11=3. In the second row (i=2) 4 pixel locations are selected: M21=4. In the third row (i=3) 4 pixel locations are selected: M31=4. It is noted that the first pattern comprises "empty" pixel locations, i.e. pixel locations which are not to be written during the first pass of the beams. The "empty" pixel locations are either selected in the pattern preceding the first pattern (drawn empty in FIG. 1) or in the next pattern (the second pattern in FIG. 1, indicated with a "+").

For each row i of the second pattern, Mi1 pixel locations to be written during a second pass of the N beams, are selected. The selected pixel locations are indicated with a plus sign "+". In the first row (i=1) 6 pixel locations 20, 21, 22, 23, 24, 25 are selected: M12=6. In the second row (i=2) 4 pixel locations are selected: M22=4. In the third row (i=3) 3 pixel locations are selected: M32=3. It is noted that the second pattern comprises "empty" pixel locations which are either selected in the pattern preceding the second pattern (indicated with a hatching in FIG. 1) or in the next pattern (the third pattern in FIG. 1, indicated with a ".").

For each row i of the third pattern, Mi3 pixel locations to be written during a third pass of the N beams, are selected. The selected pixel locations are indicated with a dot sign ".". In the first row (i=1) 5 pixel locations 30, 31, 32, 33, 34 are selected: M13=5. In the second row (i=2) 4 pixel locations are selected: M23=4. In the third row (i=3) 5 pixel locations are selected: M33=3. It is noted that the third pattern comprises "empty" pixel locations which are either selected in the second pattern preceding the third pattern (indicated with a "+" in FIG. 1) or in the next pattern (empty in FIG. 1).

In an overlap zone OV1, OV2 between subsequent patterns pixel locations are selected to be written such that a straight edge between selected pixel locations of different patterns is avoided. In particular, by leaving "holes" (unselected pixel locations) in the first pattern, see e.g. pixel locations 20, 21, in an overlap area OV1 between the first pattern and the second pattern, and filling up those "holes" by selecting those pixel locations in the second pattern, a good mixing of the first and second pattern can be achieved. A similar result can be achieved by varying the number Mi1 of selected pixels per row in the first pattern, and selecting any non-selected pixel locations in the second pattern, see e.g. the first row in overlap area OV2 where no holes are present (see also the embodiment of FIG. 4 which will be discussed below). In that case it is not required to have "holes" in the patterns. Of course, the first and the second technique may be combined, i.e. the patterns may comprise holes and the the number of selected pixels per row in the a pattern may be varied. In that manner stitching problems can be avoided or significantly limited.

Mi1, Mi2 and Mi3 have to fulfil the inequality: N−2*O<=Mi1, Mi2, Mi3<=N, i.e. 0<=Mij<=8, wherein j is an index corresponding with the subsequent patterns. Further Mi1, Mi2 and Mi3 are such that all pixel locations are selected when merging all subsequent and previous patterns. In the embodiment of FIG. 1, the first, second and third pattern do not comprise any common pixel locations in the overlap areas, such that all pixel locations are only written once. However, it is noted that the first, second and third pattern may comprise one or more common pixel locations in the overlap areas, resulting in certain pixel locations being written twice.

In the embodiment of FIG. 1, according to a possibility the pixel locations in the subsequent patterns may be selected at random, but such that every pixel location is selected in one of the subsequent patterns. For example, the selection may be random with 0<=Mij<=8. However, it is also possible to ensure that 2<=Mij<=6. In that way, the available power for feeding the beams can be divided by 6 instead of 8, since only a maximum of 6 beams of the 8 beams will have to be powered simultaneously. By increasing the available power per beam, the evaporating is faster, which allows for a higher scanning speed, resulting in a faster process.

According to a variant Mij could also be fixed at 4, wherein for each row of the first pattern two pixel locations of the first four pixel locations are selected at random, and two pixel locations of the last four pixel locations are selected at random, and wherein in the adjacent patterns the "empty" pixel locations are selected. In that case the total available power can be divided by four, resulting in an even faster evaporation.

Preferably, the selecting is such that at least one of the following conditions is fulfilled:

the Mi1 pixel locations of the first pattern (j=1) are selected such that, for a row i, at least one selected pixel location 11 thereof is separated from an adjacent selected pixel location 12 by at least one non-selected pixel location 20, 21 located in the overlap area OV1; and the Mi2 pixel locations of said second pattern are selected such that, for said row i, the non-selected pixel location 20, 21 of the first pattern (j=1) is selected in the second pattern (j=2); wherein different rows of the first pattern contain selected pixel locations in different columns of the overlap area OV1: this can be seen for example in rows 1 and 2 where different pixel locations are selected for rows 1 and 2 of the first pattern. The same principles may apply for the second and third pattern, which overlap in overlap area OV2. In that way an irregular pattern is obtained in the overlap areas such that stitching artefacts are avoided.

the Mi1 pixel locations of the first pattern may be selected such that, the number Mi1 is different for different rows and such that any non-selected pixel location of the first pattern is selected in the second pattern. The same principles may apply for the second and third pattern. Also such patterns of selected pixel locations will result in an irregular pattern in the overlap areas such that stitching artefacts are avoided.

After preparing the subsequent patterns the pixel locations may be written in accordance with the image data. The writing comprises in a first step writing simultaneously, for each row i, said Mi1 selected pixel locations by moving the N beams in the fast scan FS direction and powering the beams in accordance with the selected pixel locations and the image data to be written for the selected pixel locations. In a second step the N beams are moved with respect to said imageable material in the slow scan SS direction over (N-O) pixel locations, in the example over 4 pixel locations. In a third step for each row i, the Mi2 selected pixel locations are written simultaneously, by moving the N beams in the fast scan FS direction and powering the beams in accordance with the selected pixel locations and the image data to be written for the selected pixel locations. In the example of FIG. 1, during a first pass (j=1) of the 8 beams in the FS direction, pixel locations 10, 11 and 12 will be written in the first row (i=1), etc. Next the 8 beams are moved in the SS direction over 4 pixel locations. During a second pass (j=2) of the 8 beams in the FS direction, pixel locations 20, 21, 22, 23, 24 and 25 will be written in the first row (i=1), etc. The subsequent patterns of selected pixel locations are such that all pixel locations are written in accordance with the image data when the beams reach a border of the image to be written.

Figure 2:
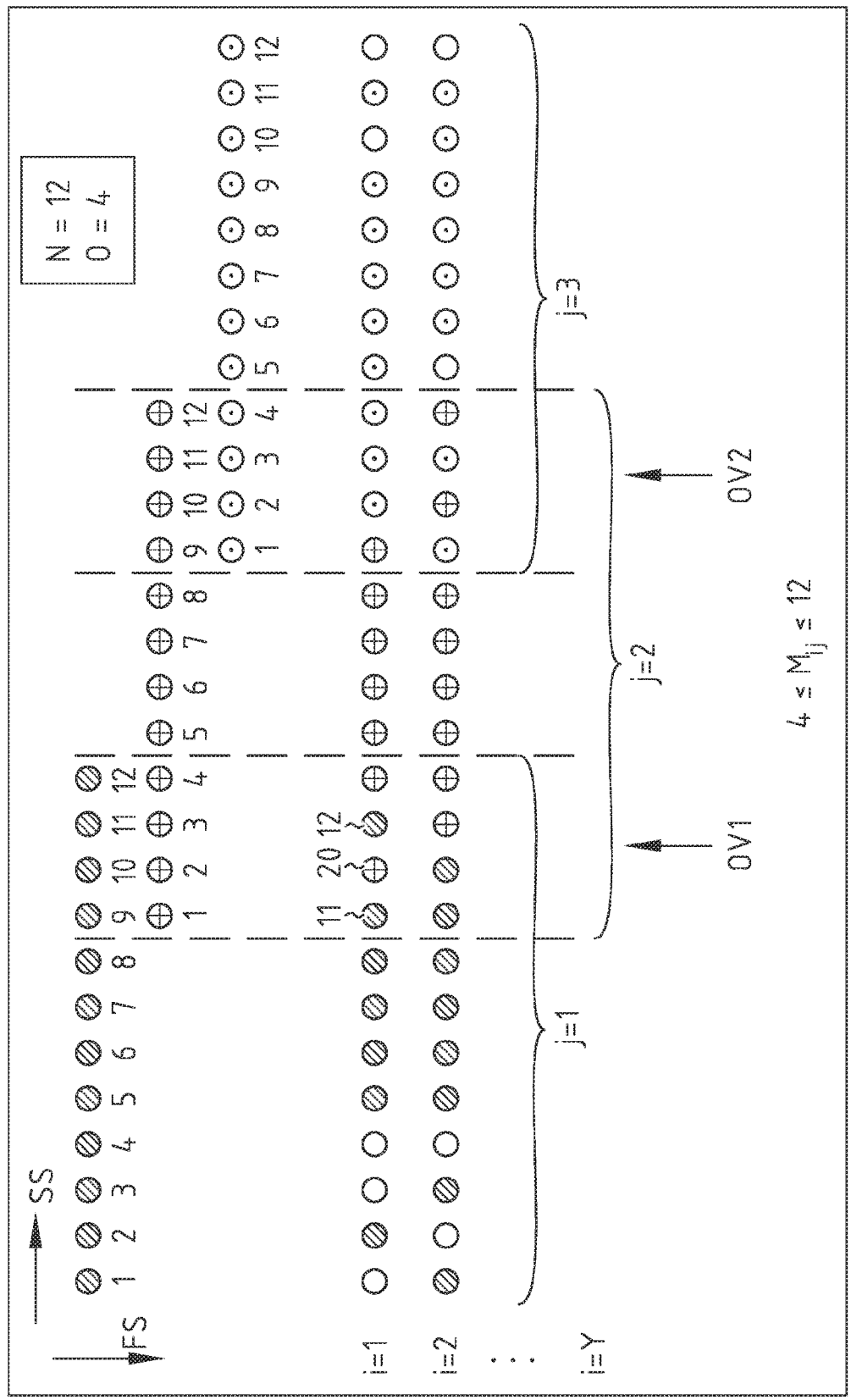
FIG. 2 illustrates schematically an exemplary embodiment of a method for writing imageable material using multiple beams, with N=12 and O=4.

FIG. 2 illustrates a second exemplary embodiment of a method for writing imageable material using N multiple beams. In the example N is 12. Using said N beams, N tracks of pixel locations, may be written simultaneously, wherein the N beams move in a fast scan direction FS. The 12 beams extend next to each other in a slow scan direction SS. In this embodiment the overlap area OV1, OV2 are chosen to be four pixel locations wide, i.e. O=4.

The exemplary method comprises preparing subsequent patterns each having Y rows of N pixel locations. The subsequent patterns including a first pattern (j=1), a second pattern (j=2) and a third pattern (j=3). In the example it is assumed that one or more patterns are available before and after the first, second and third pattern. The first and the second pattern overlap with each other in an overlap area OV1. The second and the third pattern overlap with each other in an overlap area OV2.

For each row i of the first pattern Mi1 pixel locations are selected. The selected pixel locations are indicated with a hatching. In the first row (i=1) 7 pixel locations are selected: M11=7. In the second row (i=2) 8 pixel locations are selected: M21=8, etc. It is noted that the first pattern comprises "empty" or non-selected pixel locations which are either selected in the pattern preceding the first pattern (drawn empty in FIG. 2) or in the next pattern (the second pattern in FIG. 2, indicated with a "+").

For each row i of the second pattern Mi2 pixel locations are selected. The selected pixel locations are indicated with a plus sign "+". In the first row (i=1) 7 pixel locations are selected: M12=7. In the second row (i=2) 8 pixel locations are selected: M22=8, etc. It is noted that the second pattern comprises "empty" pixel locations which are either selected in the pattern preceding the second pattern (the first pattern indicated with a hatching in FIG. 2) or in the next pattern (the third pattern in FIG. 2, indicated with a ".").

In a similar manner for each row i of the third pattern Mi3 pixel locations are selected. The selected pixel locations are indicated with a dot sign ".".

Mi1, Mi2 and Mi3 have to fulfil the inequality: $N-2*O<=Mij<=N$, i.e. $4<=Mij<=12$, wherein j is an index corresponding with the subsequent patterns. Since for each row of a pattern four pixel locations of the row do not overlap with adjacent patterns, Mij has to be at least 4. Further the values for all Mij are such that all pixel locations are selected when merging all subsequent patterns.

In the embodiment of FIG. 2, according to a possibility the pixel locations in the subsequent patterns may be selected at random, but such that every pixel location is selected in one of the subsequent patterns. For example, the selection may be random with $4<=Mij<=12$. However, it is also possible to ensure that $7<=Mij<=9$. In that way, the available power for feeding the beams can be divided by 9 instead of by 12, since only a maximum of 9 beams of the 12 beams will have to be powered simultaneously. According to a variant Mij could also be fixed on 8, wherein for each row of the first pattern two pixel locations of the first four pixel locations are selected at random, four pixel locations of the middle four pixel locations are always selected, and two pixel locations of the last four pixel locations are selected at random, and wherein in the adjacent patterns the non-selected pixel locations are selected.

Preferably, the selecting is such that at least one of the following conditions is fulfilled:

the Mi1 pixel locations of the first pattern (j=1) are selected such that, for a row i, at least one selected pixel location 11 thereof is separated from an adjacent selected pixel location 12 by at least one non-selected pixel location 20 located in the overlap area OV1; and the Mi2 pixel locations of said second pattern are selected such that, for said row i, the at least one non-selected pixel location 20 of the first pattern (j=1)

is selected in the second pattern (j=2); wherein different rows of the first pattern contain selected pixel locations in different columns of the overlap area OV1: this can be seen for example in rows 1 and 2 where different pixel locations are selected for the first pattern. The same principles may apply for the second and third pattern, which overlap in overlap area OV2. In that way an irregular pattern is obtained in the overlap areas such that stitching artefacts are avoided.

the Mi1 pixel locations of the first pattern may be selected such that, the number Mi1 is different for different rows and such that any non-selected pixel location of the first pattern is selected in the second pattern. For example, in FIG. 2 M11=7 and M21=8. The same principles may apply for the second and third pattern. Also such patterns of selected pixel locations will result in an irregular pattern in the overlap areas such that stitching artefacts are avoided.

After preparing the subsequent patterns the pixel locations may be written in accordance with the image data. The writing comprises in a first step writing simultaneously, for each row i, said Mi1 selected pixel locations by moving the 12 beams in the FS direction and powering the beams in accordance with the selected pixel locations and the image data to be written for the selected pixel locations. In a second step the 12 beams are moved with respect to said imageable material in the SS direction over 8 pixel locations. In a third step for each row i, the Mi2 selected pixel locations are written simultaneously, by moving the 12 beams in the FS direction and powering the beams in accordance with the selected pixel locations and the image data to be written for the selected pixel locations.

Also in the embodiment of FIG. 2, it is possible to ensure that Mij is within a predetermined range, e.g. 6<=Mij<=10 (example 1), or to choose Mij to be fixed, e.g. Mij=8 (example 2). In that way the available power for feeding the beams can be divided by 10 (example 1) or by 8 (example 2) instead of by 12, since only maximum 10 or 8 of the 12 moving beams will have to be powered simultaneously. By increasing the available power per beam, the evaporating is faster, which allows for a higher scanning speed, resulting in a faster process.

Figure 3:
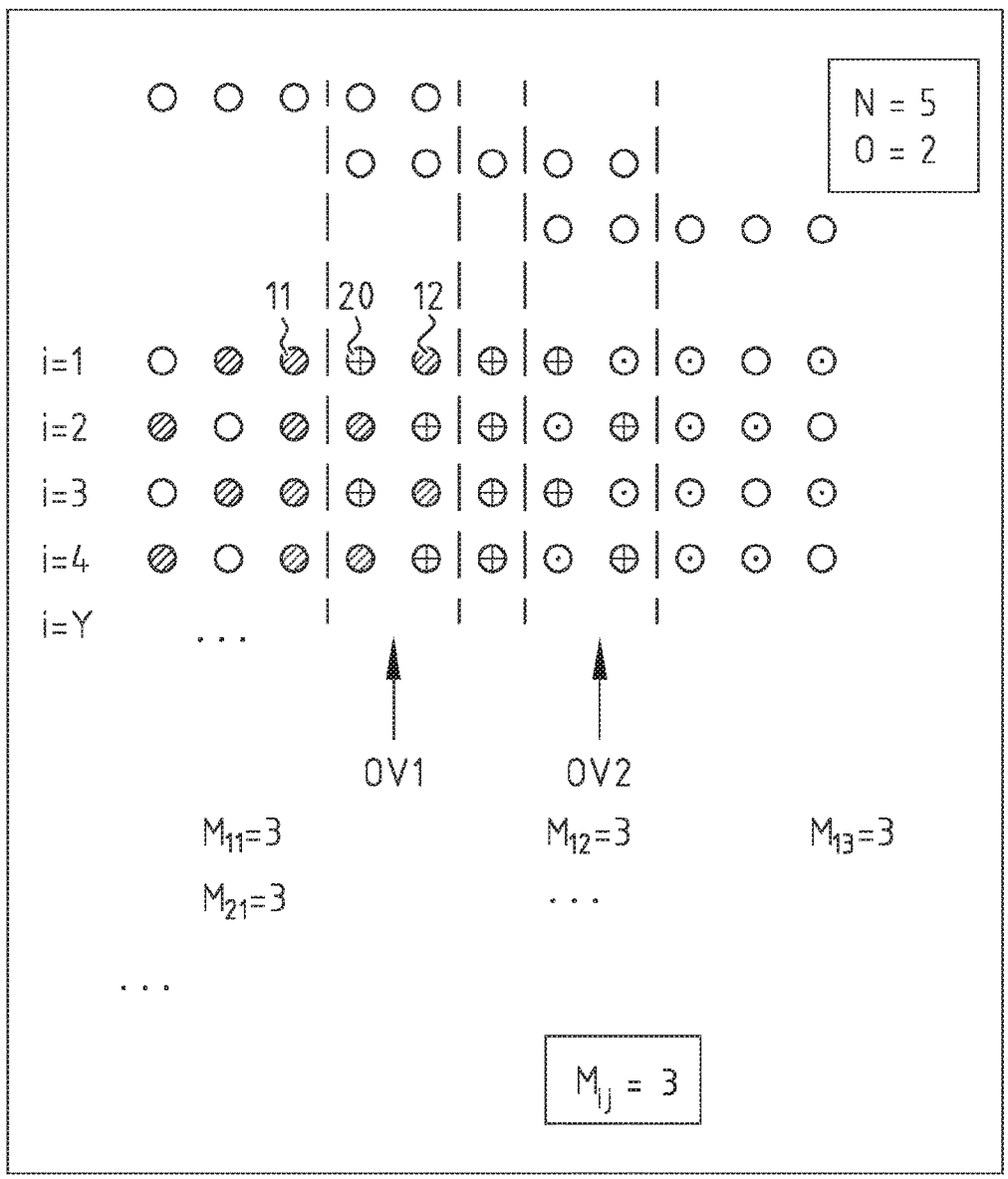
FIG. 3 illustrates schematically an exemplary embodiment of a method for writing imageable material using multiple beams, with N=5 and O=2 and a fixed number of selected pixel locations per row.

FIG. 3 illustrates a third exemplary embodiment of a method for writing imageable material using N multiple beams. In the example N is 5. Using said five beams, five tracks of pixel locations may be written simultaneously in a fast scan direction FS. The five beams extend next to each other in a slow scan direction SS. In this embodiment the overlap area OV1, OV2 are chosen to be two pixel locations wide, i.e. O=2.

The exemplary method comprises preparing subsequent patterns each having Y rows of five pixel locations. The subsequent patterns including a first pattern (j=1), a second pattern (j=2) and a third pattern (j=3). In the example it is assumed that one or more patterns are available before and after the first, second and third pattern. The first and the second pattern overlap with each other in an overlap area OV1. The second and the third pattern overlap with each other in an overlap area OV2.

For each row i of the first pattern, Mi1 pixel locations are selected. The selected pixel locations are indicated with a hatching. For each row i of the second pattern, Mi2 pixel locations are selected. The selected pixel locations of the second pattern are indicated with a plus sign "+". In a similar manner for each row i of the third pattern, Mi3 pixel locations are selected. The selected pixel locations are indicated with a dot sign ".".

In the embodiment of FIG. 3, Mij is chosen to be fixed at three selected pixel locations per row, wherein for each row of the first pattern one pixel location of the first two pixel locations is selected at random or according to an irregular pattern, the middle pixel locations is always selected, and one pixel location of the last two pixel locations is selected at random or according to an irregular pattern, and wherein in the adjacent patterns the non-selected pixel locations are selected. In that way, the selecting is such that the following condition is fulfilled. The Mi1 pixel locations of the first pattern (j=1) are selected such that, for a row i, at least one selected pixel location 11 thereof is separated from an adjacent selected pixel location 12 by at least one non-selected pixel location 20 located in the overlap area OV1; and the Mi2 pixel locations of said second pattern are selected such that, for said row i, the at least one non-selected pixel location 20 of the first pattern (j=1) is selected in the second pattern (j=2); wherein different rows of the first pattern contain selected pixel locations in different columns of the overlap area OV1: this can be seen for example in rows 1 and 2 where different pixel locations are selected for the first pattern. The same principles may apply for the second and third pattern, which overlap in overlap area OV2. In that way an irregular pattern is obtained in the overlap areas such that stitching artefacts are avoided. Further, it is possible to ensure that Mij is fixed, e.g. Mij=3. In that manner, the available power for feeding the beams can be divided by 3 instead of by 5, since only maximum 3 of the 5 beams will have to be powered simultaneously. By increasing the available power per beam, the evaporating is faster, which allows for a higher scanning speed, resulting in a faster process.

After preparing the subsequent patterns the pixel locations may be written in accordance with the image data. The writing comprises in a first step writing simultaneously, for each row i, said three selected pixel locations by moving the five beams in the FS direction and powering the beams in accordance with the three selected pixel locations and the image data to be written for those three selected pixel locations. In such an embodiment the available power for the beams may be distributed over three beams, since only three of the five moving beams need to be powered simultaneously. In a second step the five beams are moved with respect to said imageable material in the SS direction over two pixel locations. In a third step for each row i, the three selected pixel locations are written simultaneously, by moving the five beams in the FS direction and powering the beams in accordance with the three selected pixel locations and the image data to be written for the selected pixel locations.

Figure 4:
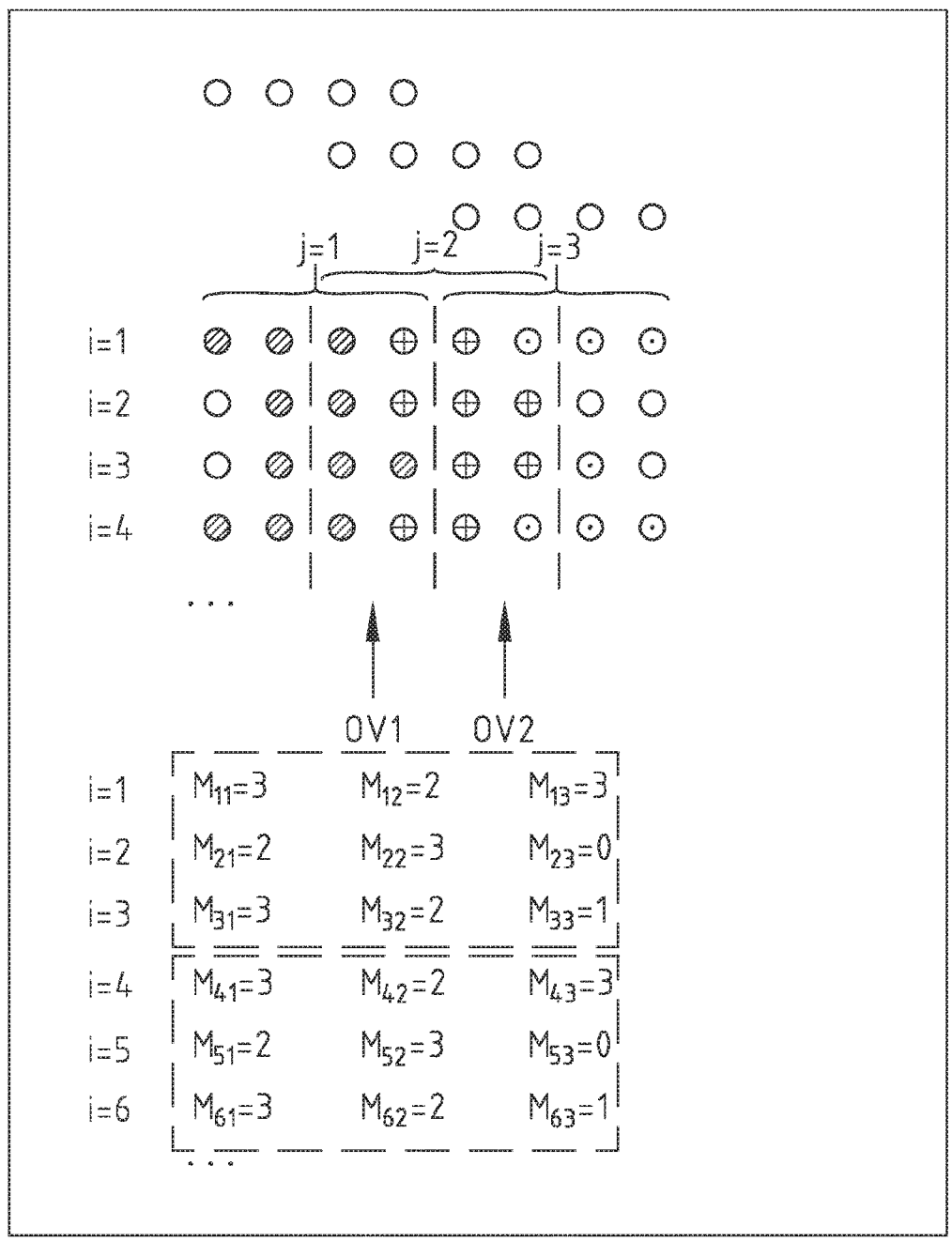
FIG. 4 illustrates schematically an exemplary embodiment of a method for writing imageable material using multiple beams, with N=4 and O=2, using a regular selection pattern.

FIG. 4 illustrates a fourth exemplary embodiment of a method for writing imageable material using N multiple beams. In the example N is 4. Using said four beams, four tracks of pixel locations may be written simultaneously in a fast scan direction FS. The four beams extend next to each other in a slow scan direction SS. In this embodiment the overlap area OV1, OV2 are chosen to be two pixel locations wide, i.e. O=2.

The exemplary method comprises preparing subsequent patterns each having Y rows of five pixel locations. The subsequent patterns including a first pattern (j=1), a second pattern (j=2) and a third pattern (j=3). In the example it is assumed that one or more patterns are available before and after the first, second and third pattern. The first and the second pattern overlap with each other in an overlap area OV1. The second and the third pattern overlap with each other in an overlap area OV2.

For each row i of the first pattern, Mi1 pixel locations are selected. The selected pixel locations are indicated with a hatching. In this embodiment Mi1 follows a regular pattern: M11=3, M21=2, M31=3, M41=3, M51=2, M61=3, etc.

For each row i of the second pattern, Mi2 pixel locations are selected. The selected pixel locations of the second pattern are indicated with a plus sign "+". Similarly Mi2 follows a regular pattern: M12=2, M22=3, M32=2, M42=2, M52=3, M62=2, etc.

In a similar manner for each row i of the third pattern, Mi3 pixel locations are selected. The selected pixel locations are indicated with a dot sign ".". Also Mi3 follows a regular pattern.

In the embodiment of FIG. 4, the selecting is such that the following condition is fulfilled. The Mi1 pixel locations of the first pattern are selected such that, the number Mi1 is different for different rows and such that any non-selected pixel location of the first pattern is selected in the second pattern. For example, in FIG. 4 M11=3 and M21=2. The same principles may apply for the second and third pattern. The pattern of selected pixel locations of FIG. 4 will result in an irregular pattern in the overlap areas OV1, OV2 such that stitching artefacts are avoided.

The pixel locations are written in accordance with the image data. The writing comprises in a first step writing simultaneously, for each row i, the Mi1 selected pixel locations by moving the four beams in the FS direction and powering the beams in accordance with the selected pixel locations and the image data to be written for those selected pixel locations. In a second step the four beams are moved with respect to said imageable material in the SS direction over two pixel locations. In a third step for each row i, the Mi2 selected pixel locations are written simultaneously, by moving the four beams in the FS direction and powering the beams in accordance with the selected pixel locations and the image data to be written for the selected pixel locations, etc.

Figure 5:
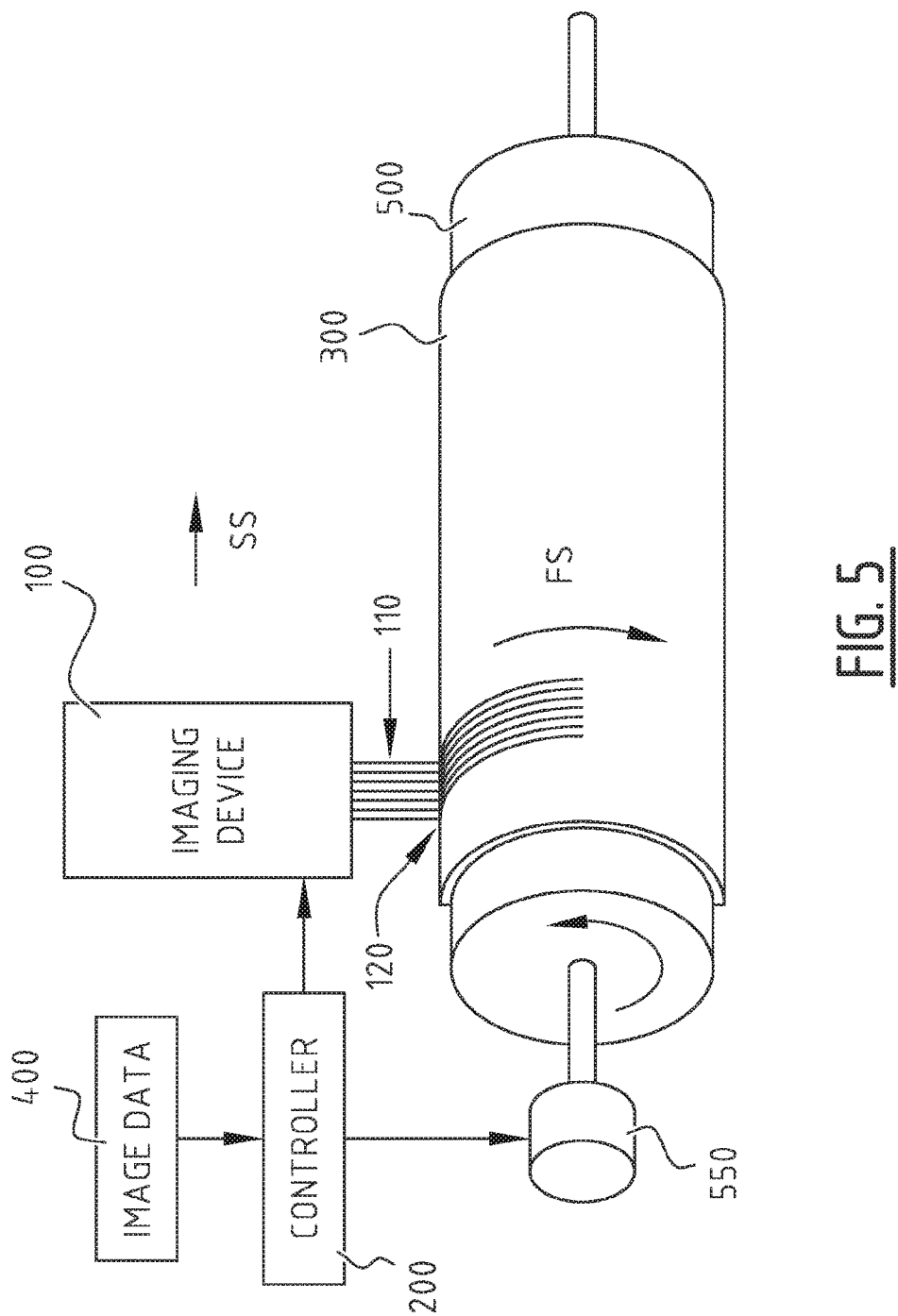
FIG. 5 illustrates schematically an exemplary embodiment of a system for writing imageable material using multiple beams.

FIG. 5 illustrates as a simple block diagram of an exemplary embodiment of a system for writing imageable material 300 using multiple laser beams 110, also called a laser beam external drum image setter. The system comprises an imaging device 100 configured for generating N beams 110, wherein N is at least four, and a controller 200 for controlling imaging device 100. Optionally there may be provided a second imaging device configured for generating N beams, and controlled by the controller 200 for operating simultaneously with the first imaging device 100. In that manner two parts of the imageable material 300 may be written in parallel. In such an embodiment the first imaging device 100 may be provided as illustrated in FIG. 5 to write a left half of the imageable material 300, and the second imaging device (not shown) may be arranged for writing, in parallel, the right half of the imageable material 300.

The controller 200 is configured for
preparing subsequent patterns each having Y rows of N pixel locations, said subsequent patterns including a first and a second pattern; wherein the first and the second pattern overlap with each other in an overlap area consisting of O columns and Y rows of pixel locations, wherein O is at least two and smaller than N;
selecting for each row i of said first pattern Mi1 pixel locations;
selecting for each row i of said second pattern Mi2 pixel locations;
The selecting by the controller 200 is such that at least one of the following conditions is fulfilled:

(1) said Mi1 pixel locations of said first pattern are selected such that, for a row i, at least one selected pixel location thereof is separated from an adjacent selected pixel location by at least one non-selected pixel location located in the overlap area; and said Mi2 pixel locations of said second pattern are selected such that, for said row i, said non-selected pixel location of the first pattern is selected in the second pattern; wherein different rows of the first pattern contain selected pixel locations in different columns of the overlap area;

(2) said Mi1 pixel locations of said first pattern are selected such that, the number Mi1 is different for different rows and such that any non-selected pixel location of the first pattern is selected in the second pattern.

Controller 200 is configured for controlling imaging device 100 for writing simultaneously, for each row i, said Mi1 selected pixel locations by moving the N beams relative to said imageable material in a fast scan direction FS; for next moving said N beams relative to said imageable material in a slow scan direction SS over (N-O) pixel locations; and for then writing simultaneously, for each row i, said Mi2 selected pixel locations by moving the N beams relative to said imageable material in the fast scan direction FS.

The imaging device 100 may include a laser beam source to form a plurality of laser beams, an imaging head arranged to receive the plurality of laser beams, to modulate the beams according to imaging data and selected pixel data from the relevant pattern, and to focus the modulated laser beams onto a row of focal spots 120, the row being oriented in a slow-scan direction SS on the surface of the imageable material 300, e.g. a flexographic plate or plate/sleeve combination to form tracks on the surface as the plate or plate/sleeve combination rotates in the fast-scan direction FS. The imaging head may include e.g. a reflector to direct the laser beams from the laser beam source to a deflector. The laser beams pass through the deflector to a multichannel AOM that modulates the beams according to the imaging data and selected pixel data from the relevant pattern. There may be provided a source of a laser beam, a deflector, and a modulator for each beam. A separate laser may be provided for each beam, for example from a laser array, or all the beams may be provided from a single laser together with a beam splitter or a multiple beam deflector, as is known in the art.

The movement in the fast scan direction FS may be achieved by rotating a drum 500 on which the imageable material 300 is fixed using a motor 550 which is controlled by controller 200. The movement in the slow scan direction may be achieved by any suitable moving mechanism (not shown) which is controlled by controller 200.

The controller 200 may comprise a programmable microcontroller in the form of a microprocessor, and a memory that includes instructions for the microprocessor. Image data 400 is input to the controller 200, and the controller 200 generates subsequent patterns with selected pixel locations for the image data. When writing Y rows of N pixel locations in accordance with the first pattern, using N beams 110, only the pixel data for the selected pixel locations is written. In other words, for a row i of the first pattern, only pixel data for Mi1 pixel locations is used for modulating the laser beams.

In a preferred embodiment, the controller 200 is configured to select pixel locations such that Mi1 and Mi2 have a fixed or maximum value which is smaller than N, more preferably smaller than N-1, for each row i. For performing the writing, typically a fixed total power is available for the N beams. The controller 200 may then be further configured to control the powering during the writing of the first pattern and the second pattern, respectively, such that the available power for each beam of the Mi1 beams and the Mi2 beams to be written simultaneously corresponds approximately with the total power divided by the fixed or maximum value of Mi1 and Mi2, respectively. When a separate laser is provided for each beam, the power of that beam may be adjusted. When the N beams are provided with a single laser together with a beam splitter or a multiple beam deflector, the beam splitting or deflecting may be adjusted depending on Mi1 and Mi2.

Note that the imager shown in FIG. 5 is an external drum imager. The method and system described herein are also readily implemented in a flat-bed imaging device or in an internal drum imaging device.

Note further that while the main application is for exposing an ablative sensitized medium, the method and system are also applicable to any imaging of any ablative or thermally sensitive recording medium using a laser imaging device.

A person of skill in the art would readily recognize that steps of various above-described methods can be performed by programmed computers, i.e. a controller. Herein, some embodiments are also intended to cover program storage devices, e.g., digital data storage media, which are machine or computer readable and encode machine-executable or computer-executable programs of instructions, wherein said instructions perform some or all of the steps of said above-described methods. The program storage devices may be, e.g., digital memories, magnetic storage media such as a magnetic disks and magnetic tapes, hard drives, or optically readable digital data storage media. The embodiments are also intended to cover computers programmed to perform said steps of the above-described methods.

The functions of the various elements shown in the figures, including any functional blocks labelled as "controllers", may be provided through the use of dedicated hardware as well as hardware capable of executing software in association with appropriate software. When provided by a controller, the functions may be provided by a single dedicated processor, by a single shared processor, or by a plurality of individual processors, some of which may be shared. Moreover, explicit use of the term "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non volatile storage. Other hardware, conventional and/or custom, may also be included. Similarly, any switches shown in the FIGS. are conceptual only. Their function may be carried out through the operation of program logic, through dedicated logic, through the interaction of program control and dedicated logic, or even manually, the particular technique being selectable by the implementer as more specifically understood from the context.

It should be appreciated by those skilled in the art that any block diagrams herein represent conceptual views of illustrative circuitry embodying the principles of the invention. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Whilst the principles of the invention have been set out above in connection with specific embodiments, it is to be understood that this description is merely made by way of example and not as a limitation of the scope of protection which is determined by the appended claims.

The invention claimed is:

1. A method for writing an imageable material using multiple beams, wherein N beams are available and N is at least four; said method comprising:
    preparing subsequent patterns each having Y rows of N pixel locations, said subsequent patterns including a first and a second pattern; wherein the first and the second pattern overlap with each other in an overlap area consisting of O columns and Y rows of pixel locations, wherein O is at least two and smaller than N;
    selecting for each row i of said first pattern Mi1 pixel locations;
    selecting for each row i of said second pattern Mi2 pixel locations;
    writing simultaneously, for each row i, said Mi1 selected pixel locations by moving the N beams in a fast scan direction relative to said imageable material; and next moving said N beams relative to said imageable material in a slow scan direction over (N-O) pixel locations;
    writing simultaneously, for each row i, said Mi2 selected pixel locations by moving the N beams in a fast scan direction relative to said imageable material;
    wherein said selecting is such that at least one of the following conditions is fulfilled:
        (1) said Mi1 pixel locations of said first pattern are selected such that, for a row i, at least one selected pixel location thereof is separated from an adjacent selected pixel location by at least one non-selected pixel location located in the overlap area; and said Mi2 pixel locations of said second pattern are selected such that, for said row i, said non-selected pixel location of the first pattern is selected in the second pattern; wherein different rows of the first pattern contain selected pixel locations in different columns of the overlap area; and
        (2) said Mi1 pixel locations of said first pattern are selected such that, the number Mi1 is different for at least two different rows and such that any non-selected pixel location of the first pattern is selected in the second pattern;
    wherein for each row i, Mi1 is selected at random or according to an irregular pattern from values in a range between N−2*O and N, wherein any pixel locations located in an area of the first pattern which does not overlap with adjacent patterns, are always selected.

2. The method of claim 1, wherein for each row i, Mi1 is selected at random such that an irregular edge between a zone written during a first pass of the N beams and a zone written during a second pass of the N beams id obtained.

3. The method of claim 1, wherein Mi1 and Mi2 have a fixed or maximum value which is smaller than N for each row i.

4. The method of claim 3, wherein, for performing the writing, a total power is available for the N beams, and wherein during the writing of the first pattern and the second pattern, respectively, the available power for each beam of the Mi1 beams and the Mi2 beams to be written simultaneously corresponds with the total power divided by the fixed or maximum value given to Mi1 and Mi2, respectively.

5. The system of claim 1, wherein, for performing the writing, a total power is available for the N beams, and wherein, during the writing of the first pattern and the second pattern, respectively, the available power is controlled such that more power is made available per beam as compared to where the total power is divided over N beams.

6. A digital data storage medium encoding a machine-executable program of instructions to perform or control at least one of the steps of the method of claim 1.

7. A system for writing imageable material using multiple beams, said system comprising:
an imaging device configured for generating N beams, wherein N is at least four;
a controller configured for
preparing subsequent patterns each having Y rows of N pixel locations, said subsequent patterns including a first and a second pattern; wherein the first and the second pattern overlap with each other in an overlap area consisting of O columns and Y rows of pixel locations, wherein O is at least two and smaller than N;
selecting for each row i of said first pattern Mi1 pixel locations;
selecting for each row i of said second pattern Mi2 pixel locations;
wherein said selecting is such that at least one of the following conditions is fulfilled:
(1) said Mi1 pixel locations of said first pattern are selected such that, for a row i, at least one selected pixel location thereof is separated from an adjacent selected pixel location by at least one non-selected pixel location located in the overlap area; and said Mi2 pixel locations of said second pattern are selected such that, for said row i, said non-selected pixel location of the first pattern is selected in the second pattern; wherein different rows of the first pattern contain selected pixel locations in different columns of the overlap area; and
(2) said Mi1 pixel locations of said first pattern are selected such that, the number Mi1 is different for at least two different rows and such that any non-selected pixel location of the first pattern is selected in the second pattern;
wherein the controller is configured for controlling said imaging device for writing simultaneously, for each row i, said Mi1 selected pixel locations by moving the N beams relative to said imageable material in a fast scan direction; for next moving said N beams relative to said imageable material in a slow scan direction over (N−O) pixel locations; and for then writing simultaneously, for each row i, said Mi2 selected pixel locations by moving the N beams relative to said imageable material in the fast scan direction; and
wherein the controller is configured to select for each row i, Mi1 at random or according to an irregular pattern from values in a range between N−2*O and N, wherein any pixel locations located in an area of the first pattern which does not overlap with adjacent patterns, are always selected.

8. The system of claim 7, wherein the imaging device is a laser imaging device.

9. The system of claim 7, wherein, for performing the writing, a total power is available for the N beams, and wherein, the controller is configured to control the powering during the writing of the first pattern and the second pattern, respectively, such that the available power for each beam of the Mi1 beams and the Mi2 beams to be written simultaneously corresponds with the total power divided by the fixed or maximum value of Mi1 and Mi2, respectively.

10. The system of claim 7, wherein, for performing the writing, a total power is available for the N beams, and wherein the controller is configured to control the powering during the writing of the first pattern and the second pattern, respectively, such that more power is made available per beam as compared to where the total power is divided over N beams.

11. A system for writing imageable material using multiple beams, said system comprising:
an imaging device configured for generating N beams, wherein N is at least four;
a controller configured for
preparing subsequent patterns each having Y rows of N pixel locations, said subsequent patterns including a first and a second pattern; wherein the first and the second pattern overlap with each other in an overlap area consisting of O columns and Y rows of pixel locations, wherein O is at least two and smaller than N;
selecting for each row i of said first pattern Mi1 pixel locations;
selecting for each row i of said second pattern Mi2 pixel locations;
wherein said selecting is such that at least one of the following conditions is fulfilled:
(1) said Mi1 pixel locations of said first pattern are selected such that, for a row i, at least one selected pixel location thereof is separated from an adjacent selected pixel location by at least one non-selected pixel location located in the overlap area; and said Mi2 pixel locations of said second pattern are selected such that, for said row i, said non-selected pixel location of the first pattern is selected in the second pattern; wherein different rows of the first pattern contain selected pixel locations in different columns of the overlap area; and
(2) said Mi1 pixel locations of said first pattern are selected such that, the number Mi1 is different for at least two different rows and such that any non-selected pixel location of the first pattern is selected in the second pattern;
wherein the controller is configured for controlling said imaging device for writing simultaneously, for each row i, said Mi1 selected pixel locations by moving the N beams relative to said imageable material in a fast scan direction; for next moving said N beams relative to said imageable material in a slow scan direction over (N−O) pixel locations; and for then writing simultaneously, for each row i, said Mi2 selected pixel locations by moving the N beams relative to said imageable material in the fast scan direction; and
wherein, for performing the writing, a total power is available for the N beams, and wherein the controller is configured to control the powering during the writing of the first pattern and the second pattern, respectively, such that more power is made available per beam compared to a situation where the total power would be divided over N beams.

12. The system of claim 11, wherein the controller is configured to perform said selecting such that every pixel is written only once.

13. The system of claim 11, wherein Mi1 and Mi2 fulfil the inequality: N−2*O<=Mi1, Mi2<=N.

14. The system of claim 11, wherein the imaging device is a laser imaging device.

15. The system of claim 11, wherein the controller is configured to select for each row i, Mi1 at random from values in a range between N−2*O and N, wherein any pixel locations located in an area of the first pattern which does not overlap with adjacent patterns, are always selected.

16. The system of claim 11, wherein the controller is configured to select pixel locations such that the selected pixel locations in the first and second pattern follow a regular pattern and wherein the controller is configured to control the powering during the writing of the first pattern and the second pattern, respectively, such that the available power for each beam of the Mi1 beams and the Mi2 beams to be written simultaneously corresponds with the total power divided by the fixed or maximum value of Mi1 and Mi2, respectively.

17. The system of claim 11, wherein the controller is configured to select pixel locations such that Mi1 and Mi2 have a fixed or maximum value which is smaller than N for each row i.

18. The system of claim 11, wherein a laser array with a separate laser is provided for each beam.

19. The system of claim 11, comprising a drum, wherein the fast scan direction corresponds with a rotating direction of the drum.

20. The system of claim 1, further comprising a drum, wherein the fast scan direction corresponds with a rotating direction of the drum.

* * * * *